United States Patent
Hayashizaki et al.

(10) Patent No.: US 7,523,539 B2
(45) Date of Patent: Apr. 28, 2009

(54) METHOD OF MANUFACTURING A PROBE

(75) Inventors: Takayuki Hayashizaki, Aomori (JP); Hideki Hirakawa, Aomori (JP); Akira Soma, Aomori (JP); Shinji Kuniyoshi, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/935,378

(22) Filed: Nov. 5, 2007

(65) Prior Publication Data

US 2008/0143368 A1 Jun. 19, 2008

(30) Foreign Application Priority Data

Dec. 14, 2006 (JP) ............................. 2006-336687

(51) Int. Cl.
*G01R 3/00* (2006.01)
(52) U.S. Cl. .................... 29/595; 29/592.1; 29/837; 29/845; 29/885; 216/18; 324/762
(58) Field of Classification Search ............... 29/592.1, 29/595, 837, 845, 885; 216/18; 324/762
See application file for complete search history.

(56) References Cited

U.S. PATENT DOCUMENTS

2003/0222668 A1 * 12/2003 Hung et al. ................. 324/762

FOREIGN PATENT DOCUMENTS

| JP | 2000-162241 | 6/2000 |
|---|---|---|
| JP | 2000-162241 A | 6/2000 |
| WO | WO 2004/102207 A1 | 11/2004 |

* cited by examiner

*Primary Examiner*—Paul D Kim
(74) *Attorney, Agent, or Firm*—Ingrassia Fisher & Lorenz, P.C.

(57) ABSTRACT

In a probe manufacturing method, after a metal material for a probe is deposited on a base table, the probe can be detached from the base table relatively easily without damaging the probe. A recess corresponding to a flat surface shape of a probe is formed by a resist mask on a sacrificial layer on a base table, and a probe is formed by depositing a probe material in the recess. Thereafter, the resist mask is removed, and further the sacrificial layer is removed by an etching process with a part of the sacrificial layer remaining. For the purpose of forming an opening for control of the remaining part of the sacrificial layer in the etching process in the probe so as to let the opening pass through the probe in its plate thickness direction, a hole-forming portion for the opening is formed in the resist mask. Etching of the sacrificial layer in the etching process is promoted from an edge of the opening formed in the probe by this hole-forming portion.

8 Claims, 5 Drawing Sheets

METHOD OF MANUFACTURING A PROBE

BACKGROUND OF THE INVENTION

The present invention relates to a probe used in an electrical test of a device under test such as a semiconductor integrated circuit (hereinafter referred to as IC) and a method for manufacturing the same.

A plurality of ICs formed on a semiconductor wafer generally undergo an electrical test before being separated into respective chips to determine whether or not they are manufactured in accordance with the specification. The electrical test of this kind can be performed by using a probe assembly comprising a probe substrate and a plurality of probes attached to the probe substrate (e.g., refer to Patent Documents 1 and 2).

The probe of such a probe assembly is formed by using a silicon wafer as a base table, taking the flat form of the probe with a resist mask on the base table by making use of a photolithography technique, sequentially depositing metal materials in the recess on the base table formed by the resist mask to form the probe, and thereafter removing the probe from the base table, as described in Patent Document 1.

To remove the probe from the silicon base table, an etching technique is utilized. For prevention of damage on the probe caused by the etching and easy detachment of the probe, a sacrificial layer made of a metal material such as copper different from the probe material is formed on the base table, and the probe material is deposited on the sacrificial layer. Thus, by removing the sacrificial layer by means of, for example, wet etching with etchant, the probe can be detached from the silicon base table.

However, when the probe is soaked in the etchant until the sacrificial layer is completely removed, the probe itself may be damaged by the etchant. Also, since a plurality of micro probes are formed integrally on the base table, the plurality of micro probes may float on the etchant by the etching, in which case it is difficult to handle them.

Accordingly, it is preferable to finish the etching process without giving substantial damage on the probe itself by the etchant and in a state where the minimum and proper amount of sacrificial layer remains between the silicon base table and the probe required to achieve easy detachment of the probe and to hold the probe on the silicon base table. If a large amount of sacrificial layer remains after the etching, the probe will be detached by an external force with use of a tool such as a cutter knife or a spatula. Detachment of the probe attached to the silicon base table by the remaining large amount of sacrificial layer requires a strong force, and thus such a process may deform the probe.

For these reasons, it has been necessary to keep observing the etching process for detachment of the probe from the base table for a relatively long time so that the etching process is performed appropriately, and the manufacturing process has been complicated in some cases. Thus, a novel manufacturing method that enables time reduction and simplification of the probe manufacturing process has been desired.

[Patent Document 1] Japanese Patent Appln. Public Disclosure No. 2000-162241

[Patent Document 2] International Publication WO2004/102207 Pamphlet

BRIEF SUMMARY OF THE INVENTION

It is an object of the present invention to provide a probe manufacturing method enabling relatively easy detachment of a probe from a base table, after a material for the probe is deposited on the base table, without giving damage on the probe formed by the deposition.

The present invention is a probe manufacturing method comprising the steps of forming a recess corresponding to a flat surface shape of a desired probe by a resist mask on a sacrificial layer formed on a base table, after depositing a probe material in the recess, within which the sacrificial layer is exposed, to form a probe made of the probe material over the base table via the sacrificial layer, removing the resist mask, removing the sacrificial layer by an etching process with a part of the sacrificial layer remaining, and detaching from the base table the probe held on the base table by the remaining part of the sacrificial layer, and is characterized in that, for the purpose of forming an opening for control of the remaining part of the sacrificial layer in the etching process in the probe so as to let the opening pass through the probe in its plate thickness direction, a hole-forming portion for the opening is formed in the resist mask to promote etching of the sacrificial layer in the etching process at an edge of the opening.

In the probe manufacturing method according to the present invention, since the hole-forming portion for forming the opening is formed in the resist mask forming a deposition area of the probe material, the sacrificial layer is etched by etchant from the edge of the opening as well as from the outer edge of the probe in the etching process of the sacrificial layer. Thus, since the sacrificial layer can be etched by the etching process in shorter time than in a conventional case, reduction in etching process time is enabled. Also, since the etching process time is more reduced than in the conventional case, the observation work for the appropriate etching process is eased, and the manufacturing process is simplified.

In the probe manufacturing method according to the present invention, an entirely plate-shaped probe comprising an attachment portion having an attachment end to be attached to a probe substrate, an arm portion extending in a lateral direction from the attachment portion, and a probe tip portion provided integrally with the arm portion, extending in a direction opposite a side of the arm portion where the attachment end of the attachment portion is located, and provided with a probe tip at its tip end, can be formed.

In this case, a recess corresponding to a flat surface shape of the attachment portion, the arm portion, and the probe tip portion can be formed over the base table by the resist mask, the probe material having a predetermined thickness can be deposited on the sacrificial layer in the recess, and the hole-forming portion for the opening that promotes etching at the time of the etching process can be formed at a part of the resist mask corresponding to the attachment portion.

The opening is formed in the attachment portion of the probe so as to pass through the attachment portion in its plate thickness direction, the sacrificial layer is removed by the etching process at an area except a partial area in proximity to the hole-forming portion, and the probe is detached from the base table in a state where it is held on the base table via a part remaining at the partial area of the sacrificial layer.

The arm portion can make a pair.

The etching process in which the sacrificial layer partially remains at the partial area in proximity to the hole-forming portion can be a two-step etching process having a first etching process in which both parts of the sacrificial layer corresponding to the attachment portion and the probe tip portion remain and a second etching process in which, after the first etching process, the part corresponding to the probe tip portion is removed, and in which the part corresponding to the attachment portion is removed except at the partial area.

In this case, heat treatment can be provided to the probe material in a state where the probe is supported on the base table at two points by the both parts corresponding to the probe tip portion and the attachment portion of the sacrificial layer by the first etching process. During this heat treatment, the probe is held on the base table by the both parts corresponding to the probe tip portion and the attachment portion away from each other. Thus, introduction of a retroflexion to the probe due to the heat treatment can be restricted.

With the probe manufacturing method according to the present invention, a probe in which in the attachment portion is formed an opening that promotes etching of a part of the sacrificial layer corresponding to the attachment portion in the etching process so as to pass through the attachment portion in its plate thickness direction can be obtained.

According to the present invention, since the etching of the sacrificial film proceeds from the edge of the opening formed in the probe as well, as described above, a longtime etching process as in the conventional case is not required. Thus, it is possible to detach the probe from the base table with a smaller detachment force than in the conventional case without giving damage on the probe main body by the etching. Accordingly, since it is possible to detach the probe from the base table more easily than in the conventional case without giving damage on the arm portion, the probe can be manufactured more easily than in the conventional case.

DESCRIPTION OF THE PREFERRED EMBODIMENTS

Figure 1:
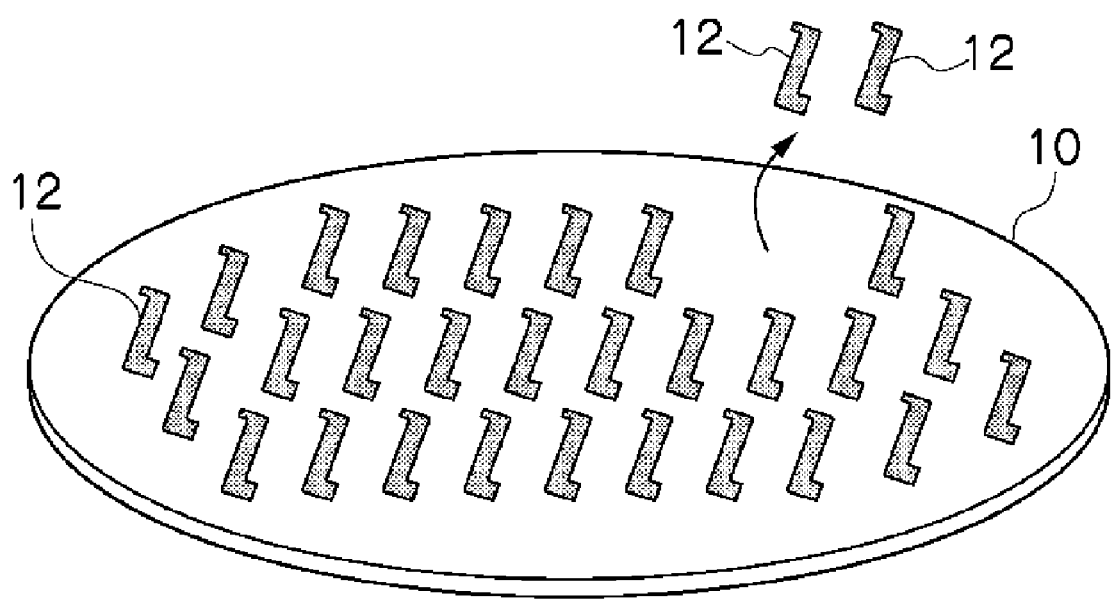
FIG. 1 is a perspective view showing a process of removing a probe according to the present invention from a base table.

In a probe manufacturing method according to the present invention, a silicon substrate 10 is used as a base table, for example, and a plurality of probes 12 are integrally formed on the base table, as shown in FIG. 1.

Figure 2:
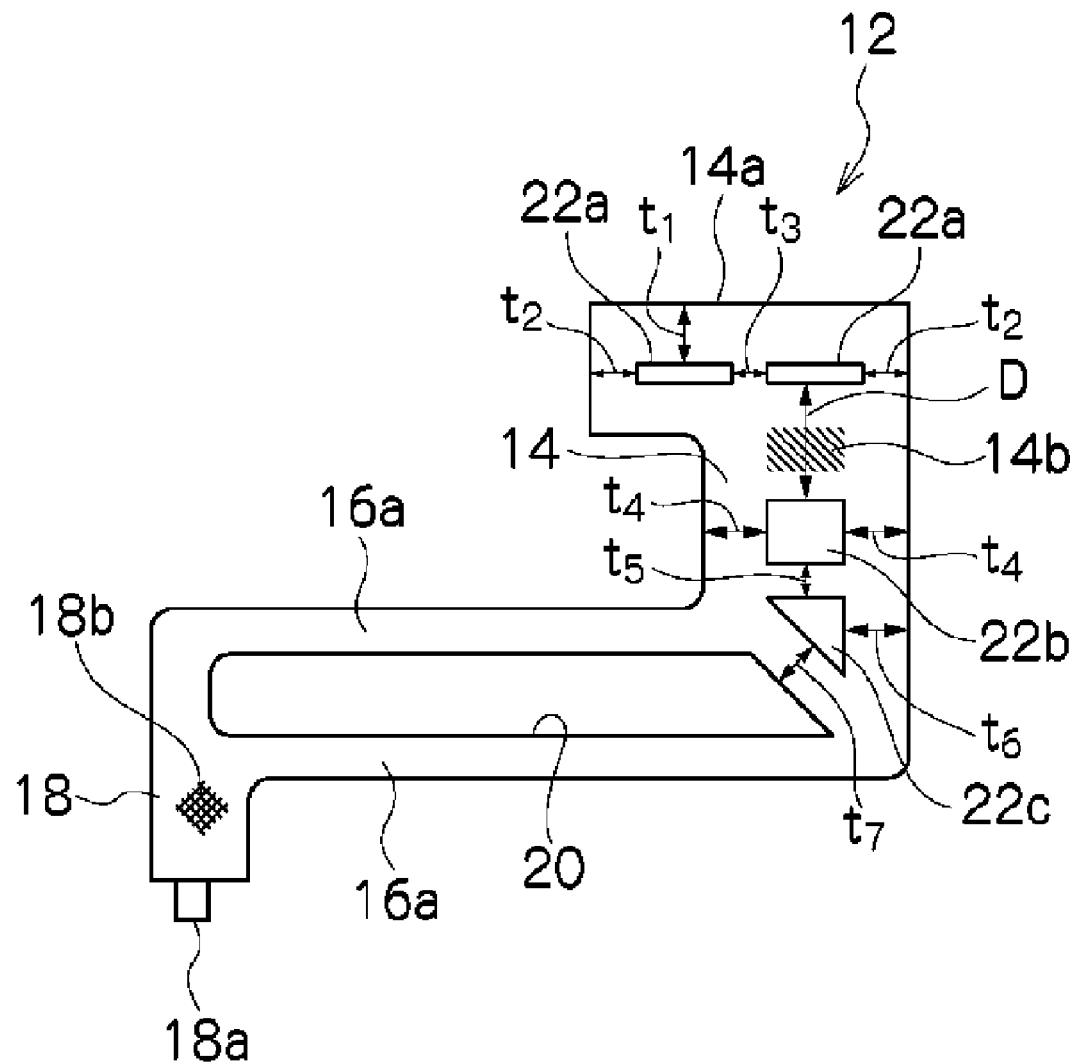
FIG. 2 is a plan view showing an example of a probe according to the present invention.

FIG. 2 shows an example of a probe manufactured by the method according to the present invention. The probe 12 according to the present invention is formed entirely in a flat plate shape. The probe 12 comprises an attachment portion 14 having an attachment end 14a to be attached to an electrode disposed on a not shown probe substrate, an arm portion 16 extending in a lateral direction from the lower end of the attachment portion, and a probe tip portion 18 extending downward from the tip end of the arm portion, and a probe tip 18a is formed at the tip end of the probe tip portion.

In the example shown in the figure, the arm portion 16 has a pair of arm portions 16a, 16a extending in parallel with each other between the attachment portion 14 and the probe tip portion 18. Thus, between the both arm portions 16a is formed a space 20 passing through the probe 12 in the plate thickness direction. In addition, a plurality of openings 22 (22a, 22a, 22b, 22c) passing through the probe 12 in the plate thickness direction are further formed on the attachment portion 14.

The openings 22a, 22a are formed in slit-like elongated rectangular cross-sectional shapes and are formed along the attachment end 14a with their longitudinal sides aligned in the vicinity of the attachment end 14a of the attachment portion 14. The opening 22b is formed in an approximately square cross-sectional shape and has the largest opening area among the openings 22a, 22a, 22b, 22c. This opening 22b is located approximately at the center of the attachment portion 14 between one opening 22a and the opening 22c. Also, the opening 22c is formed in a triangular cross-sectional shape and is formed between the attachment portion 14 and the arm portion 16.

By the arrangement of these openings 22, a distance t (t1 to t7) between the edge of each opening 22 and the outer edge of the attachment portion 14 or the space 20 is shorter than a distance D between the aforementioned one opening 22a and the opening 22b. The flat surface shape of each opening 22 may be selected arbitrarily.

The attachment end 14a of the probe 12 is fixed to the aforementioned electrode of the aforementioned probe substrate as mentioned above, and thereby the probe 12 is connected to a corresponding circuit of a tester via a conductive path formed in the aforementioned probe substrate, as is conventionally well known, which is not shown in the figure. The probe tip 18a of each probe 12 is thrust on an electrode of a device under test for an electrical test of the device under test such as an IC circuit with use of the aforementioned tester. At this time, the probe tip 18a of the probe 12 is connected to the aforementioned electrode reliably with appropriate flexibility by elastic deformation of the both arm portions 16a, 16a.

Figure 3:
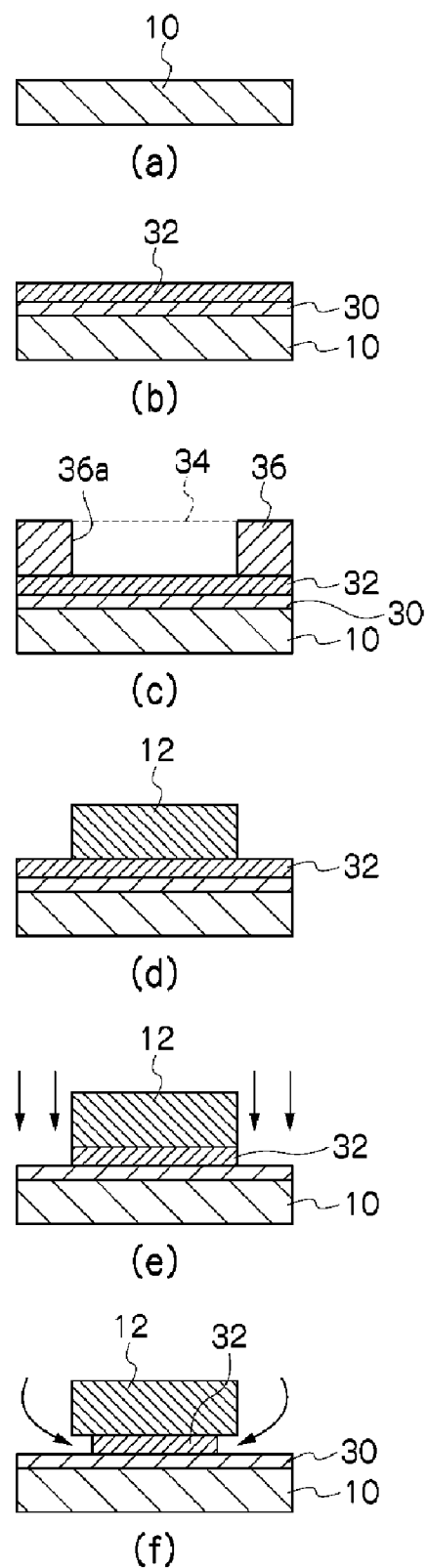
FIGS. 3 (a) to 3 (f) are process diagrams showing manufacturing procedures of a probe according to the present invention.

A manufacturing process of the probe 12 according to the present invention will be explained with reference to FIG. 3. As shown in FIG. 3 (a), a silicon substrate 10 whose surface has undergone mirror finish by etching is prepared as a base table.

Prior to growth of a sacrificial film made of, for example, copper on the silicon substrate 10, an adhesive film 30 such as nickel is formed by, for example, a sputtering technique for promotion of the copper growth. On this adhesive film 30 is suitably deposited copper by, for example, the sputtering technique to form a sacrificial film 32 (FIG. 3 (b)).

A photoresist material, which is a photosensitive material, is coated on the sacrificial film 32 by, for example, a spin coat technique so as to have uniform thickness, and thus a photoresist layer 34 is formed. This photoresist layer 34 is selectively exposed with use of a pattern mask (not shown) having a flat surface shape of the probe 12 shown in FIG. 1 and is subsequently developed (FIG. 3 (c)). As a result, a resist mask 36 having a recess 36a formed in a flat surface shape corresponding to the flat surface shape of the probe 12 is formed over the silicon substrate 10. This resist mask 36 exposes the sacrificial film 32 on the bottom surface of its recess 36a.

Figure 4:
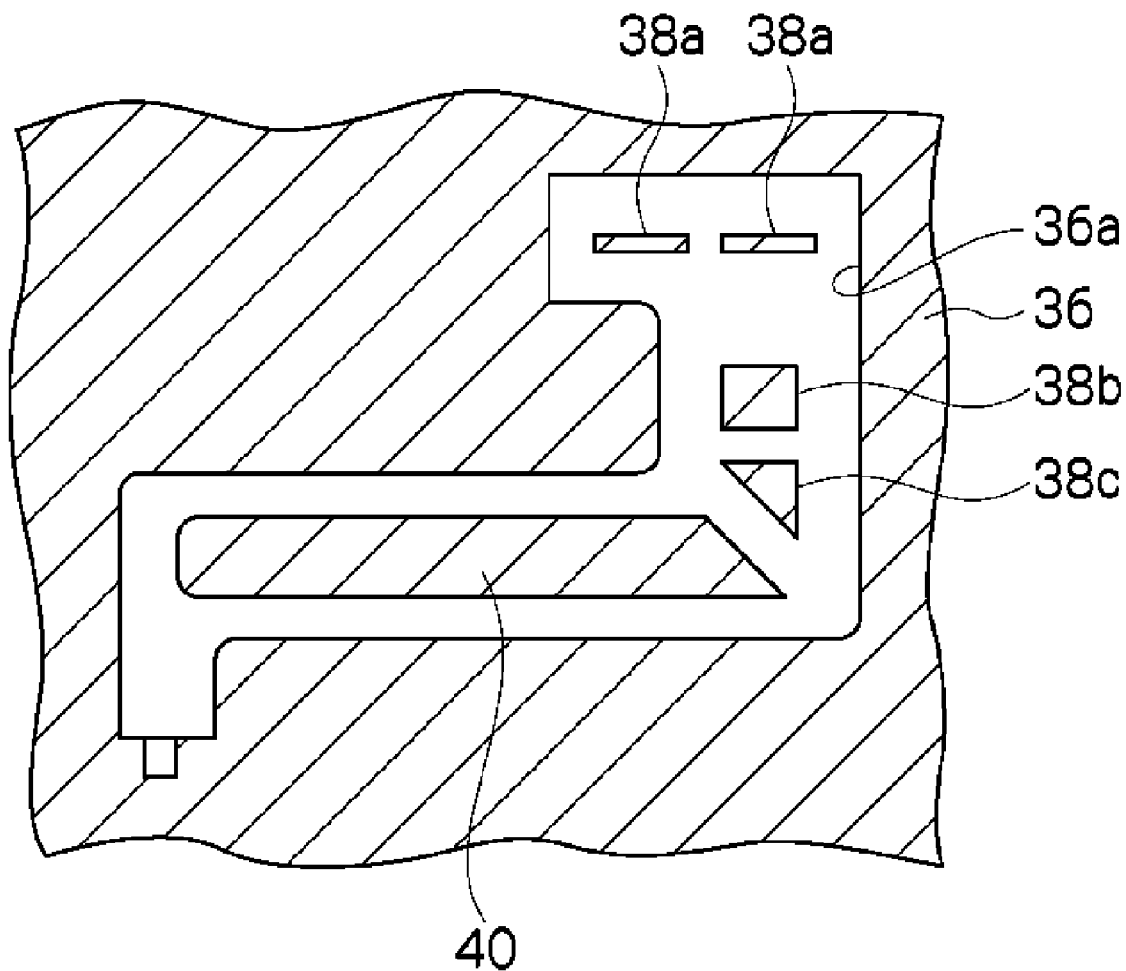
FIG. 4 is a plan view showing a resist mask used for obtaining the probe shown in FIG. 2.

The flat surface shape of the resist mask 36 is shown in FIG. 4. As apparent from comparison with FIG. 2, the resist mask 36 has hole-forming portions 38 (38a to 38c) and 40 formed within the recess 36a. The hole-forming portion 40 is adapted to form the space 20 between the arm portions 16a, 16a and corresponds to the space. On the other hand, the hole-forming portions 38 (38a to 38c) are specific to the present invention. The hole-forming portions 38a, 38a correspond to the openings 22a, 22a of the probe 12 while the hole-forming portions 38b and 38c respectively correspond to the openings 22b and 22c of the probe 12.

Within the recess 36a of the resist mask 36 is deposited a conventionally well-known probe metal material such as nickel, nickel-phosphor alloy, rhodium, or tungsten by, for example, an electroplating technique. As a result of the deposition of the probe metal material within the recess 36a, the probe 12 shown in FIG. 2 is formed and fixed on the sacrificial film 32 of the silicon substrate 10.

After the probe 12 is formed on the sacrificial film 32, the resist mask 36 is removed (FIG. 3 (d)). After the removal of the resist mask 36, a wet etching process with use of etchant is performed for removal of the sacrificial film 32 exposed from the probe 12 in order to detach the probe 12 from the silicon substrate 10. In this wet etching process, the portion of the sacrificial film 32 exposed from the probe 12 is first etched from its edge as shown in FIG. 3 (e).

As the etching process continues, the etching of the sacrificial film 32 progresses from the edge of the probe 12 toward its center portion as shown in FIG. 3 (f).

By the etching of the sacrificial film 32, the sacrificial film 32 is etched over areas except parts corresponding to areas denoted in FIG. 2 by a numeral 14b and a numeral 18b, and thus the etching process is interrupted at the time when the parts corresponding to the numerals 14b and 18b remain.

Since the parts of the sacrificial film 32 corresponding to the numerals 14b and 18b remain by the interruption of the etching process, the probe 12 is held on the silicon substrate 10 at the two points by the remaining parts of the sacrificial film 32. The area denoted by the numeral 14b is located approximately at the center of the attachment portion 14, and the area denoted by the numeral 18b is located in proximity to the probe tip 18a and relatively away from the area denoted by the numeral 14b.

In the state where the probe 12 is held on the silicon substrate 10 at the two points corresponding to these two areas (14b, 18b) away from each other by the remaining parts of the sacrificial film 32, the probe 12 undergoes heat treatment.

This heat treatment reinforces strength of the probe 12 and introduces a retroflexion force to the probe 12 due to the application of heat. However, as described above, since the probe 12 is held on the silicon substrate 10 at the two points away from each other by the remaining parts of the sacrificial film 32, the deformation is restricted. Thus, the deformation with the retroflextion of the probe 12 caused by the heat treatment is suitably prevented.

After the aforementioned heat treatment, the aforementioned etching process is resumed. By the resumption of the etching process, that is, a second etching process, the remaining part of the sacrificial film 32 remained at the area denoted by the numeral 18b is completely removed.

As a result, the probe 12 is held on the silicon substrate 10 only at a remaining part 32a (refer to FIG. 5) of the sacrificial film 32 remained at the area denoted by the numeral 14b and further etched.

Figure 5:
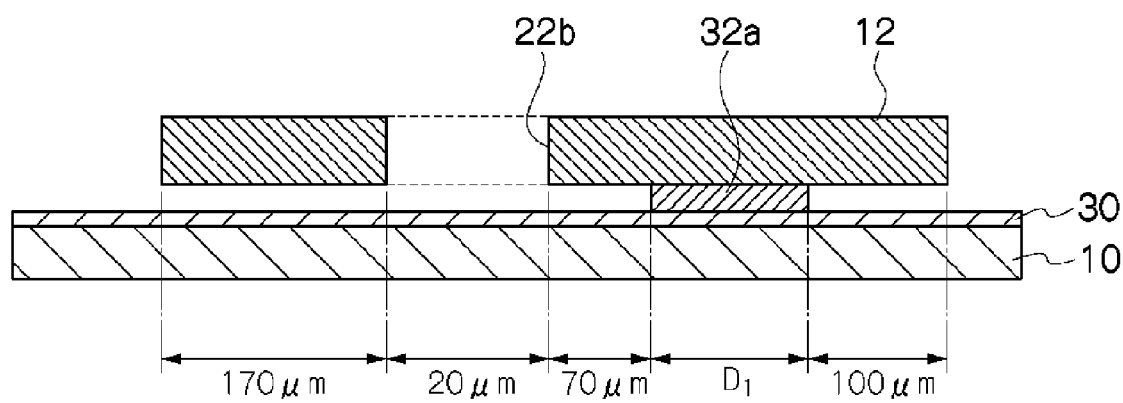
FIG. 5 is a cross-sectional view schematically showing an example of a sacrificial layer that remains by an etching process.

FIG. 5 is a cross-sectional view schematically showing one example of this. Ultimately, the second etching process was finished when a distance from the single remaining part 32a of the sacrificial film 32 to the outer edge of the probe 12 reaches 100 μm, and when a distance from the edge of the adjacent opening 22b reaches 70 μm.

In the aforementioned method according to the present invention, the etching of the sacrificial film 32 proceeds from the edge of the opening 22b as well. On the other hand, in a case where no opening 22b is provided, the sacrificial film 32 cannot undergo etching from the edge of the opening 22b toward the remaining part of the sacrificial film 32. Thus, in such a case, the etching of the sacrificial film 32 from the edge of the opening 22b cannot be started at an early stage as in the case of the present invention. Also, other openings 22 (22a, 22a, 22c) promote the etching of the sacrificial film 32, as well as the opening 22b.

Accordingly, by means of the shorter-time etching process than a conventional one, it is possible to remove unnecessary parts from the sacrificial film 32 and to leave the remaining part 32a appropriate for detachment of the probe 12. Thus, even when the probe 12 held on the silicon substrate 10 via the remaining part 32a is to be detached with a cutter knife or a spatula, no strong external force is required, and the probe 12 can be detached from the silicon substrate 10 without giving deformation or damage on the probe 12.

In the example shown in FIG. 5, the probe material was nickel-phosphor alloy including phosphor of 8 to 10% by weight and was deposited with a thickness of approximately 43 μm. The thickness of the sacrificial film was approximately 0.3 μm. The etchant was one consisting primarily of tetra amine copper chloride and marketed by Meltex Inc. under the trade name of "A-Process." It was used without being diluted, and its temperature was approximately 50 degrees centigrade. In this case, the outer dimension D1 of the remaining part 32a was approximately 50 μm, and it took about 20 minutes in total for the first and second etching processes.

Although heat treatment was performed between the first and second etching processes in the aforementioned example, the heat treatment may be omitted. In such a case, the sacrificial film 32 undergoes a single etching process until the appropriate remaining part 32a remains.

The present invention is not limited to the above embodiments but may be altered in various ways without departing from the spirit and scope of the present invention.

What is claimed is:

1. A probe manufacturing method comprising the steps of:
forming a recess corresponding to a flat surface shape of a desired probe having a thickness direction by a resist mask on a sacrificial layer formed on a base table;
after depositing a probe material in said recess, within which said sacrificial layer is exposed, to form a probe made of said probe material over said base table via said sacrificial layer, removing said resist mask;
removing said sacrificial layer by an etching process with a part of said sacrificial layer remaining; and
detaching from said base table said probe held on said base table by said remaining part of said sacrificial layer,
wherein, for forming an opening for control of said remaining part of said sacrificial layer in said etching process in said probe so as to let said opening pass through said probe in the thickness direction thereof, a hole-forming portion for said opening is formed in said resist mask to promote etching of said sacrificial layer in said etching process at an edge of said opening.

2. The probe manufacturing method according to claim 1, wherein said probe is an entirely plate-shaped probe comprising an attachment portion having an attachment end to be attached to a probe substrate of a probe assembly, an arm portion extending in a lateral direction from said attachment portion, and a probe tip portion provided integrally with said arm portion, extending in a direction opposite a side of said arm portion where said attachment end of said attachment portion is located, and provided with a probe tip at a tip end of said probe tip portion.

3. The probe manufacturing method according to claim 2, wherein in said attachment portion is formed said opening that promotes etching of a part of said sacrificial layer corresponding to said attachment portion in said etching process so as to pass through said attachment portion in the thickness direction of the probe.

4. The probe manufacturing method according to claim 2, wherein a recess corresponding to a flat surface shape of said attachment portion, said arm portion, and said probe tip portion is formed over said base table by said resist mask, said probe material having a predetermined thickness is deposited on said sacrificial layer in said recess, and said hole-forming portion for said opening that promotes etching at the time of said etching process is formed at a part of said resist mask corresponding to said attachment portion.

5. The probe manufacturing method according to claim 2, wherein said opening is formed in said attachment portion of said probe so as to pass through said attachment portion in the thickness direction of the probe, said sacrificial layer is removed by said etching process at an area except a partial area in proximity to said hole-forming portion, and aid probe is detached from said base table in a state where it is held on said base table via a part remaining at said partial area in proximity to said hole-forming portion.

6. The probe manufacturing method according to claim 5, wherein said etching process in which said sacrificial layer partially remains at said partial area in proximity to said hole-forming portion is a two-step etching process having a first etching process in which both parts of said sacrificial layer corresponding to said attachment portion and said probe tip portion remain and a second etching process in which, after said first etching process, said part corresponding to said probe tip portion is removed, and in which said part corresponding to said attachment portion is removed except at said partial area.

7. The probe manufacturing method according to claim 6, wherein said probe material undergoes heat treatment in a state where said probe is supported on said base table at two points by said both parts corresponding to said probe tip portion and said attachment portion of said sacrificial layer by said first etching process.

8. The probe manufacturing method according to claim 2, wherein said arm portion comprises a pair of arms.

* * * * *